(12) United States Patent
Gmeinwieser et al.

(10) Patent No.: US 8,816,353 B2
(45) Date of Patent: Aug. 26, 2014

(54) OPTOELECTRONIC SEMICONDUCTOR CHIP AND METHOD FOR PRODUCING AN OPTOELECTRONIC SEMICONDUCTOR CHIP

(75) Inventors: Nikolaus Gmeinwieser, Obertraubling (DE); Matthias Sabathil, Regensburg (DE); Andreas Leber, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 253 days.

(21) Appl. No.: 13/138,034

(22) PCT Filed: Nov. 2, 2009

(86) PCT No.: PCT/DE2009/001550
§ 371 (c)(1),
(2), (4) Date: Feb. 8, 2012

(87) PCT Pub. No.: WO2010/072187
PCT Pub. Date: Jul. 1, 2010

(65) Prior Publication Data
US 2012/0146044 A1    Jun. 14, 2012

(30) Foreign Application Priority Data

Dec. 23, 2008   (DE) .................. 10 2008 062 932

(51) Int. Cl.
*H01L 29/15* (2006.01)
*H01L 21/00* (2006.01)
*H01L 33/22* (2010.01)

(52) U.S. Cl.
CPC ..................................... *H01L 33/22* (2013.01)
USPC ............................................. 257/76; 438/29

(58) Field of Classification Search
USPC ............. 257/76, E33.06, E33.023, 98; 438/29
See application file for complete search history.

(56) References Cited

U.S. PATENT DOCUMENTS

| | | | |
|---|---|---|---|
| 7,196,359 B2 | 3/2007 | Baur et al. | |
| 2006/0076565 A1 | 4/2006 | Murofushi et al. | |
| 2006/0097271 A1 | 5/2006 | Eisert et al. | |
| 2006/0237734 A1 | 10/2006 | Baur et al. | |
| 2006/0278888 A1 | 12/2006 | Kim et al. | |
| 2007/0262300 A1 | 11/2007 | Cho et al. | |
| 2007/0267640 A1 | 11/2007 | Lee et al. | |
| 2007/0269918 A1 | 11/2007 | Cho et al. | |
| 2008/0035941 A1 | 2/2008 | Harle | |
| 2008/0179380 A1 | 7/2008 | Baur et al. | |
| 2009/0001407 A1 | 1/2009 | Osawa et al. | |
| 2009/0045434 A1 | 2/2009 | Muraki et al. | |
| 2009/0065800 A1 | 3/2009 | Wirth et al. | |

FOREIGN PATENT DOCUMENTS

| | | |
|---|---|---|
| CN | 1672270 | 9/2005 |
| DE | 101 39 723 | 3/2003 |
| DE | 102 34 977 | 2/2004 |
| DE | 103 13 606 | 10/2004 |
| DE | 103 40 271 | 4/2005 |
| DE | 10 2006 017573 | 10/2007 |
| DE | 10 2007 061 140 | 5/2009 |
| JP | 2007-165515 | 6/2007 |
| JP | 2007 220972 | 8/2007 |
| JP | 2007-311801 | 11/2007 |
| JP | 2008-198876 | 8/2008 |
| WO | WO 2005/041313 | 5/2005 |
| WO | WO 2005/081319 | 9/2005 |
| WO | WO 2009/076921 | 6/2009 |

*Primary Examiner* — Fernando L Toledo
*Assistant Examiner* — Neil Prasad
(74) *Attorney, Agent, or Firm* — Cozen O'Connor (57) ABSTRACT

In at least one embodiment of the optoelectronic semiconductor chip (1), the latter comprises a semiconductor layer sequence (2) comprising at least one active layer (3) designed for generating an electromagnetic radiation. Furthermore, the optoelectronic semiconductor chip (1) has coupling-out structures (4), which are fitted at least indirectly on a radiation passage area (20) of the semiconductor layer sequence (2). In this case, a material of the coupling-out structures (4) is different than a material of the semiconductor layer sequence (2). The refractive indices of the materials of the coupling-out structures (4) and of the semiconductor layer sequence (2) deviate from one another by at most 30%. Furthermore, facets (40) of the coupling-out structures (4) have a total area amounting to at least 30% of an area content of the radiation passage area (20).

14 Claims, 6 Drawing Sheets

OPTOELECTRONIC SEMICONDUCTOR CHIP AND METHOD FOR PRODUCING AN OPTOELECTRONIC SEMICONDUCTOR CHIP

RELATED APPLICATIONS

This application is a U.S. National Phase Application under 35 USC 371 of International Application No. PCT/DE2009/001550, filed on Nov. 11, 2009.

This patent application claims the priority of German patent application 10 2008 062 932.4 filed Dec. 23, 2008, the disclosure content of which is hereby incorporated by reference.

BACKGROUND OF THE INVENTION

An optoelectronic semiconductor chip is specified. Furthermore, a method for producing an optoelectronic semiconductor chip is specified.

The document US 2007/0267640 A1 relates to a light-emitting semiconductor diode and a method for producing such a diode.

SUMMARY OF THE INVENTION

An object to be achieved is to specify an optoelectronic semiconductor chip which exhibits a high light coupling-out efficiency. A further object to be achieved is to specify a method for producing an optoelectronic semiconductor chip.

In accordance with at least one embodiment of the optoelectronic semiconductor chip, the latter comprises a semiconductor layer sequence comprising at least one active layer for generating an electromagnetic radiation. The active layer can have at least one pn junction and/or at least one quantum well. By way of example, the semiconductor chip can be shaped as a thin-film chip, as described in the document WO 2005/081319 A1, the disclosure content of which with regard to the semiconductor chip described therein and the production method described therein is hereby incorporated by reference. Furthermore, the semiconductor layer sequence can have cladding layers, waveguide layers and/or current spreading layers.

In accordance with at least one embodiment of the optoelectronic semiconductor chip, the entire semiconductor layer sequence is based on the same material system, wherein individual layers of the semiconductor layer sequence can have a different material composition, for instance a different doping. By way of example, the semiconductor layer sequence is based on GaN, GaP or GaAs, wherein, in particular, a proportion for instance of Al and/or In can vary within the layer sequence. The semiconductor layer sequence can likewise comprise varying proportions of P, B, Mg and/or Zn.

In accordance with at least one embodiment of the optoelectronic semiconductor chip, the latter has coupling-out structures designed to increase a coupling-out efficiency with regard to coupling out from the semiconductor chip radiation generated in the active layer during the operation of the semiconductor chip.

In accordance with at least one embodiment of the optoelectronic semiconductor chip, the coupling-out structures have facets. In this case, facets are all boundary areas of the coupling-out structures or parts of those boundary areas which face away from the semiconductor layer sequence and which form an angle of between 15° and 75° inclusive with a radiation passage area of the semiconductor layer sequence. The facet of a coupling-out structure can be formed by a single, continuous area. If the coupling-out structures are truncated cones, for example, then the facets are formed by lateral outer areas of the truncated cones. If the coupling-out structures are hemisphere-like, for example, then the facets are only those parts of the boundary areas whose tangents form an angle of between 15° and 75° inclusive with the radiation passage area, wherein the tangents in each case lie in planes perpendicular to the radiation passage area.

In this case, the radiation passage area of the optoelectronic semiconductor chip is preferably that area, in particular planar within the scope of the production tolerances, which is oriented perpendicularly to a growth direction of the semiconductor layer sequence and bounds the latter in a direction perpendicular to the growth direction. That is to say that the radiation passage area is a main side of the semiconductor layer sequence. In particular, the radiation passage area is situated at a side of the semiconductor layer sequence which faces away from a carrier or substrate. The radiation passage area is designed to the effect that at least part of the radiation generated in the semiconductor layer sequence leaves the semiconductor layer sequence through the radiation passage area.

In accordance with at least one embodiment of the optoelectronic semiconductor chip, the coupling-out structures are fitted at least indirectly on the radiation passage area of the semiconductor layer sequence. That is to say that, by way of example, a material of an electrode serving for making electrical contact with the semiconductor layer sequence can be situated between the coupling-out structures and the radiation passage area.

Preferably, however, the coupling-out structures are fitted directly on the radiation passage area. In other words, a material of the coupling-out structures, at least in places, is in direct contact with the radiation passage area or with the semiconductor material of the semiconductor layer sequence with which the radiation passage area is formed.

In accordance with at least one embodiment of the optoelectronic semiconductor chip, the material of the coupling-out structures is different than the material of the semiconductor layer sequence. In this case, different means that the coupling-out structures are based on a different material system than the semiconductor layer sequence. In particular, therefore, this does not mean that the materials of coupling-out structures and semiconductor layer sequence differ merely in terms of a doping or in terms of a proportion of a material component. For example, the semiconductor layer sequence is based on GaN, while the coupling-out structures are based on $TiO_2$.

In accordance with at least one embodiment of the optoelectronic semiconductor chip, the refractive indices of the materials of the coupling-out structures and of the semiconductor layer sequence deviate from one another by at most 30%. In other words, the absolute value of the quotient of the difference between the refractive indices of the two materials and the refractive index of the material of the semiconductor layer sequence is less than or equal to 0.30. In this case, the material of the semiconductor layer sequence should be understood to mean, in particular, that material of the semiconductor layer sequence by which the radiation passage area is formed. The coupling-out structures and the semiconductor layer sequence can therefore have a mutually different refractive index.

Refractive index should be understood here to mean, in particular, in each case the refractive index at a relevant wavelength or in a relevant wavelength range. The relevant wavelength is, in particular, a wavelength of the radiation generated in the semiconductor layer sequence.

In accordance with at least one embodiment of the optoelectronic semiconductor chip, a total area of the facets of the coupling-out structures amounts to at least 5%, preferably at least 20%, in particular at least 60%, of an area content of the radiation passage area. In other words, the sum of the areas of all the facets, that is to say of all the boundary areas of the coupling-out structures, which are arranged obliquely with respect to the radiation passage area, corresponds at least to the values mentioned above. This is to say that the total area of the facets is therefore related to the area content of the radiation passage area.

In at least one embodiment, it is also possible for the total area of the facets to be greater than the area content of the radiation passage area. In this case, the areas of the facets amount to more than 100% of the area content of the radiation passage area.

According to at least one embodiment of the optoelectronic semiconductor chip, the latter comprises a semiconductor layer sequence comprising at least one active layer designed for generating an electromagnetic radiation. Furthermore, the optoelectronic semiconductor chip has coupling-out structures, which are fitted at least indirectly on a radiation passage area of the semiconductor layer sequence. In this case, a material of the coupling-out structures is different than a material of the semiconductor layer sequence. The refractive indices of the materials of the coupling-out structures and of the semiconductor layer sequence deviate from one another by at most 30%.

Furthermore, facets of the coupling-out structures have a total area amounting to at least 5% of an area content of the radiation passage area.

By means of such coupling-out structures, which have, in particular, a small difference in refractive index with respect to the material of the semiconductor layer sequence, it is possible to ensure a high coupling-out efficiency with regard to coupling out from the semiconductor chip the radiation generated in the latter. Since the coupling-out structures are fashioned with a different material than the semiconductor layer sequence, the production of the coupling-out structures and hence also of the optoelectronic semiconductor chip can additionally be simplified.

In accordance with at least one embodiment of the optoelectronic semiconductor chip, the coupling-out structures cover a proportion of the radiation passage area of at least 20%, in particular of at least 40%. If the coupling-out structures are in direct contact with the radiation passage area, then, that proportion of the radiation passage area which is in direct contact with the material of the coupling-out structures is at least 20% or at least 40%, respectively. If the coupling-out structures are applied indirectly on the radiation passage area, then a projection of areas of the coupling-out structures which face the semiconductor layer sequence onto the radiation passage area has a proportion of the latter of at least 20%. In this case, the projection is effected in a direction perpendicular to the radiation passage area.

In accordance with at least one embodiment of the optoelectronic semiconductor chip, the coupling-out structures cover a proportion of the radiation passage area of at most 80%.

In accordance with at least one embodiment of the optoelectronic semiconductor chip, the refractive indices of the materials of the coupling-out structures and of the semiconductor layer sequence deviate from one another by at most 20%, in particular by at most 10%. If the deviation is at most 10%, for example, and a refractive index of the semiconductor layer sequence has a value of approximately 2.5, then the refractive index of the material of the coupling-out structures is between 2.25 and 2.75 inclusive.

In accordance with at least one embodiment of the optoelectronic semiconductor chip, the refractive indices of the materials of the coupling-out structures and of the semiconductor layer sequence deviate from one another by at most 5%.

In accordance with at least one embodiment of the optoelectronic semiconductor chip, the proportion of the radiation passage area which is covered by the coupling-out structures is greater than 35% and less than 65%.

In accordance with at least one embodiment of the optoelectronic semiconductor chip, the coupling-out structures are arranged in a regular, in particular two-dimensional, pattern on the radiation passage area. In this case, regular can mean that the pattern has a unit cell. A regular arrangement of the coupling-out structures can be realized by means of a photolithographic process, for example.

In accordance with at least one embodiment of the optoelectronic semiconductor chip, the coupling-out structures are arranged on the radiation passage area in a hexagonal grid. In other words, a unit cell of the arrangement of the coupling-out structures is a hexagon, in particular a regular and/or equilateral hexagon.

In accordance with at least one embodiment of the optoelectronic semiconductor chip, the coupling-out structures have a lateral extent, that is to say in a direction parallel to the radiation passage area, of between 0.2 µm and 10 µm inclusive, in particular between 1 µm and 3 µm inclusive. Preferably, the lateral extent of the coupling-out structures is greater than a wavelength of the radiation generated in the semiconductor layer sequence. In particular, the lateral extent of the coupling-out structures corresponds to at least double the wavelength of the radiation. In this case, the wavelength denotes the wavelength of the radiation in the material of the semiconductor layer sequence.

In accordance with at least one embodiment of the optoelectronic semiconductor chip, islands are formed by the material of the coupling-out structures, wherein adjacent islands are separated from one another. In other words, adjacent islands of the coupling-out structures do not touch one another. Therefore, between adjacent coupling-out structures or islands, there is no connection by the material of the coupling-out structures themselves. The islands are in each case formed, in particular, by precisely one structure element of the coupling-out structures. By way of example, islands are then shaped in truncated-cone-like fashion.

In accordance with at least one embodiment of the optoelectronic semiconductor chip, a distance between adjacent coupling-out structures or islands is at least as large as the vacuum wavelength of the radiation generated in the semiconductor layer sequence. As a result, it is possible, for example, to reduce effects in a manner similar to that in the case of a diffraction grating.

In accordance with at least one embodiment of the optoelectronic semiconductor chip, the coupling-out structures are fashioned in sphere-segment-like fashion, in dome-like fashion, in pyramid-like fashion and/or in truncated-cone-like fashion, wherein a base area of the coupling-out structures faces the radiation passage area. In this case, the base area corresponds, for example, to the base area of a dome, of a truncated pyramid or of a truncated cone. The angle between the facets of these coupling-out structures and the radiation passage area is approximately 45°, for example.

In this case, in dome-like fashion means that a, in particular single, boundary area of a solid coupling-out structure, said boundary area facing away from the radiation passage area, is curved or round. The facets of the coupling-out structures are then only the parts of said boundary areas which are at an angle of between 15° and 75° inclusive with respect to the radiation passage area.

In accordance with at least one embodiment of the optoelectronic semiconductor chip, the coupling-out structures have a height, in a direction perpendicular to the radiation passage area, of between 0.3 µm and 10 µm inclusive, in particular between 0.5 µm and 3 µm inclusive.

In accordance with at least one embodiment of the optoelectronic semiconductor chip, the lateral extent of the semiconductor chips is equal or approximately equal to the height of the coupling-out structures. Approximately equal can mean that the height and the lateral extent deviate from one another by less than 25%, in particular by less than 10%.

In accordance with at least one embodiment of the optoelectronic semiconductor chip, the entire radiation passage area, within the scope of the production tolerances, is uniformly covered by the coupling-out structures. That is to say that an arrangement pattern of the coupling-out structures on the entire radiation passage area does not vary, within the scope of the production tolerances.

In accordance with at least one embodiment of the optoelectronic semiconductor chip, the coupling-out structures are shaped in sphere-segment-like fashion. In this case, in sphere-segment-like fashion does not preclude the fact that the coupling-out structures can have the form of a segment of an ellipsoid.

In accordance with at least one embodiment of the optoelectronic semiconductor chip, the material of the coupling-out structures is transparent to the radiation generated in the semiconductor layer sequence. In other words, less than 20%, in particular less than 5%, of the radiation which is generated in the semiconductor layer sequence and which passes through the coupling-out structures is absorbed by the material of the coupling-out structures. The coupling-out structures are therefore fashioned in a manner transparent with respect to the radiation generated.

In accordance with at least one embodiment of the optoelectronic semiconductor chip, the material of the coupling-out structures has a scattering effect for the radiation generated in the semiconductor layer sequence. Preferably, the material absorbs less than 20%, in particular less than 5%, of the radiation which is generated in the semiconductor layer sequence and which passes through the coupling-out structures.

In accordance with at least one embodiment of the optoelectronic semiconductor chip, the coupling-out structures have at least one layer-like, continuous region in which a plurality of openings are formed. The openings completely penetrate through the layer-like region, in a direction toward the radiation passage area. Preferably, the openings extend at least as far as the radiation passage area of the semiconductor layer sequence. Preferably, the openings do not penetrate, or do not significantly penetrate, into the semiconductor layer sequence. The facets of the coupling-out structures are at least partly formed by the openings. In other words, a layer composed of the material of the coupling-out structures is shaped at least one partial region of the radiation passage area, and the openings, perforations, cutouts or holes are shaped into said layer. Through said openings, lateral interfaces are formed in said layer, wherein said interfaces, at least in part, constitute facets of the coupling-out structures. Preferably, the openings taper towards the radiation passage area. By way of example, the openings have a truncated-cone-like or truncated-pyramid-like shape, wherein a narrower base side faces the radiation passage area.

In accordance with at least one embodiment of the optoelectronic semiconductor chip, the coupling-out structures are formed with a dielectric material. Dielectric can also mean, in particular, that a specific electrical conductivity of the material of the coupling-out structures is less than a specific electrical conductivity of that material of the semiconductor layer sequence which forms the radiation passage area at least by a factor of 10, preferably at least by a factor of 100. In this case, therefore, dielectric does not necessarily preclude the fact that the material of the coupling-out structures has semiconducting properties with a low specific electrical conductivity.

In accordance with at least one embodiment of the optoelectronic semiconductor chip, the material of the coupling-out structures is electrically conductive. Preferably, the electrical conductivity of the material of the coupling-out structures then exceeds that of the material of the semiconductor layer sequence.

In accordance with at least one embodiment of the optoelectronic semiconductor chip, the material of the coupling-out structures comprises one of the following substances or consists of one of these substances: $TiO_2$, ZnS, AlN, SiC, BN, $Ta_2O_5$.

In accordance with at least one embodiment of the optoelectronic semiconductor chip, the refractive index of the material of the coupling-out structures is at least 2.1, preferably at least 2.25, in particular at least 2.4.

In accordance with at least one embodiment of the optoelectronic semiconductor chip, at least one conductive layer is applied in places on the radiation passage area of the semiconductor layer sequence, wherein the conductive layer is fashioned from a transparent conductive oxide, in particular. The conductive layer is designed to have a high electrical transverse conductivity. By means of the conductive layer, therefore, it is possible to realize uniform impressing of current into the semiconductor layer sequence across the entire radiation passage area. By way of example, the conductive layer is fashioned with indium tin oxide, ITO for short, with indium zinc oxide, IZO for short, or with ZnO, or consists of one of these materials.

In accordance with at least one embodiment of the optoelectronic semiconductor chip, the conductive layer is partly or, preferably, completely penetrated by the coupling-out structures. By way of example, holes are introduced into the conductive layer, for instance by means of etching, into which holes the coupling-out structures are applied or grown. In this case, the material of the coupling-out structures is preferably in direct contact with the material of the radiation passage area. By virtue of the fact that the coupling-out structures penetrate through the conductive layer, a high coupling-out efficiency is ensured. This holds true, in particular, since the refractive index of, for example, transparent conductive oxides with values of around 2.0 is relatively small in comparison, for example, with GaN, refractive index approximately 2.5.

In accordance with at least one embodiment of the optoelectronic semiconductor chip, the radiation passage area on which the coupling-out structures are applied is formed with n-conducting material.

In accordance with at least one embodiment of the optoelectronic semiconductor chip, the radiation passage area, within the scope of the production tolerances, is fashioned in a planar manner.

In accordance with at least one embodiment of the optoelectronic semiconductor chip, the coupling-out structures rise, in a direction away from the semiconductor layer sequence, above the material of the semiconductor layer sequence. In other words, the coupling-out structures are not formed by material removal or depressions in the semiconductor layer sequence, but rather are applied and/or grown on the semiconductor layer sequence after the completion thereof.

In accordance with at least one embodiment of the optoelectronic semiconductor chip, a wavelength of the radiation generated in the semiconductor layer sequence is in the ultraviolet, visible and/or near-infrared spectral range. The radiation therefore has a wavelength of between 200 nm and 1500 nm inclusive, in particular between 340 nm and 1080 nm inclusive.

In accordance with at least one embodiment of the optoelectronic semiconductor chip, a wavelength of the radiation generated in the semiconductor layer sequence is, in particular, less than or equal to 600 nm. The radiation is therefore, in particular, ultraviolet radiation or formed by blue or green light.

In accordance with at least one embodiment of the optoelectronic semiconductor chip, the angle between the flanks and the radiation passage area is between 40° and 50° inclusive.

In accordance with at least one embodiment of the optoelectronic semiconductor chip, the material of the semiconductor layer sequence is formed with GaN, InGaN, AlGaN and/or AlInGaN. A wavelength of the radiation is, in particular, less than or equal to 600 nm. The angle between the facets and the radiation passage area is between 30° and 60° inclusive. Moreover, the coupling-out structures are shaped in truncated-cone-like fashion and consist of $TiO_2$.

In accordance with at least one embodiment of the optoelectronic semiconductor chip, the functioning or mode of operation of the coupling-out structures can be described approximately by means of geometrical optics. Therefore, the coupling-out structures do not form, in particular, a photonic crystal based on wave optics. A typical length scale or periodicity of the coupling-out structures therefore corresponds to at least one wavelength of the radiation to be coupled out from the semiconductor layer sequence.

In accordance with at least one embodiment of the optoelectronic semiconductor chip, the main sides of the semiconductor layer sequence have no patterning or roughening. In other words, the main sides of the semiconductor layer sequence are smooth. If the semiconductor chip comprises a conductive layer, then the latter is preferably also smooth and not roughened.

Furthermore, a method for producing an optoelectronic semiconductor chip is specified. The method can be used to produce, for example, an optoelectronic semiconductor chip such as is specified in conjunction with at least one of the embodiments described.

In accordance with at least one embodiment of the method, a semiconductor layer sequence comprising at least one active layer is grown on a substrate. The growth process can be an epitaxial growth process. The substrate is a growth substrate, in particular.

In accordance with at least one embodiment of the method, a light-sensitive material is applied to a radiation passage area of the semiconductor layer sequence and patterned. The light-sensitive material is, for example, a photoresist or some other material which can be patterned by means of radiation. In this case, radiation can also denote UV radiation, x-ray radiation, electron radiation or ion radiation.

Structuring is, for example, exposure by means of a photomask and, if appropriate, subsequent development of the light-sensitive material. In other words, patterning consists in the formation of, in particular, phototechnologically cured regions of the light-sensitive material. In this context, therefore, patterning does not mean significant removal of light-sensitive material.

In accordance with at least one embodiment of the method, the light-sensitive material is removed in partial regions. The removal process can be an etching or incineration process. By way of example, unexposed or alternatively exposed regions of the light-sensitive material are incinerated, etched away wet-chemically or by means of a plasma and/or washed away or dissolved by means of a solvent.

In accordance with at least one embodiment of the method, instead of the light-sensitive material, a mask is applied, for example, by means of a stamp method or a printing method at the radiation passage area of the semiconductor layer sequence. It is also possible to use a so-called imprint method, in which a material forming the mask is applied in an, in particular homogeneous, layer, wherein openings are then subsequently produced in said layer by means of a stamp, for example, before the material is cured. The coupling-out structures are then formed in said openings.

In accordance with at least one embodiment of the method, the material forming the coupling-out structures is applied in a layer, which is homogeneous, in particular, within the scope of the production tolerances, at the radiation passage area of the semiconductor layer sequence. Said layer is subsequently fashioned to form the coupling-out structures, for example by means of a photolithographic process and/or by means of wet-chemical or dry-chemical etching.

In accordance with at least one embodiment of the method, coupling-out structures, situated at least indirectly at the radiation passage area, are produced in the partial regions. The process of producing the coupling-out structures can be a growth process and/or a vapor deposition process. It is also possible for the coupling-out structures to be produced by means of a self-assembling process.

In accordance with at least one embodiment of the method, in particular after the coupling-out structures have been produced, the remaining light-sensitive material is removed. The removal process can be realized by a process of blowing away, for example. This process of removing the remaining light-sensitive material can also be used to remove a residual material—deposited on the light-sensitive material—of the material forming the coupling-out structures.

According to at least one embodiment of the method for producing an optoelectronic semiconductor chip, said method comprises the following steps:

growing a semiconductor layer sequence comprising at least one active layer on a substrate,     applying and patterning a light-sensitive material at a radiation passage area of the semiconductor layer sequence,     removing the light-sensitive material in partial regions,     producing coupling-out structures at least indirectly at the radiation passage area in the partial regions, and     removing the remaining light-sensitive material.

Preferably, the order of the method steps is implemented as indicated. However, a deviating order can likewise be employed, depending on a specific configuration of the optoelectronic semiconductor chip to be produced.

In accordance with at least one embodiment of the method, prior to the application and patterning of the light-sensitive material, a conductive layer, in particular precisely one conductive layer, is produced at least in places between the light-sensitive material and the radiation passage area of the semiconductor layer sequence.

In accordance with at least one embodiment of the method, with the removal of the light-sensitive material in the partial regions, the conductive layer is likewise removed in said partial regions. In other words, material of the conductive layer and light-sensitive material are removed in the same method step, in particular in the same etching step. Therefore, the same mask, in the form of the light-sensitive material, is used for producing a pattern or a structure of the conductive layer and for producing the coupling-out structures.

In accordance with at least one embodiment of the method, the latter comprises the step of rebonding the grown semiconductor layer sequence onto a carrier. Therefore, the carrier is, in particular, not a growth substrate. The carrier is designed to mechanically carry and support the semiconductor layer sequence. Preferably, the process of rebonding onto the carrier is effected before the step of applying and patterning the light-sensitive material.

The method can comprise further steps. By way of example, electrical contacts can be produced, a semiconductor layer sequence grown in a wafer assemblage can be divided into a multiplicity of separate semiconductor chips, and/or a potting compound, for example a silicone or an epoxide, can be applied over the semiconductor layer sequence and/or the coupling-out structures.

Some areas of application in which optoelectronic semiconductor chips described here can be used are, for instance, the backlighting systems of displays or display devices. Furthermore, the semiconductor chips described here can also be used in illumination devices for projection purposes, in headlights or light emitters or in general lighting.

BRIEF DESCRIPTION OF THE DRAWINGS

An optoelectronic semiconductor chip described here and a method for producing an optoelectronic semiconductor chip will be explained in greater detail below with reference to the drawing on the basis of exemplary embodiments. In this case, identical reference symbols indicate identical elements in the individual figures. However, no relationships to scale are illustrated in this case; rather, individual elements may be illustrated with an exaggerated size in order to afford a better understanding.

In the figures.

DETAILED DESCRIPTION OF THE DRAWINGS

Figure 1:
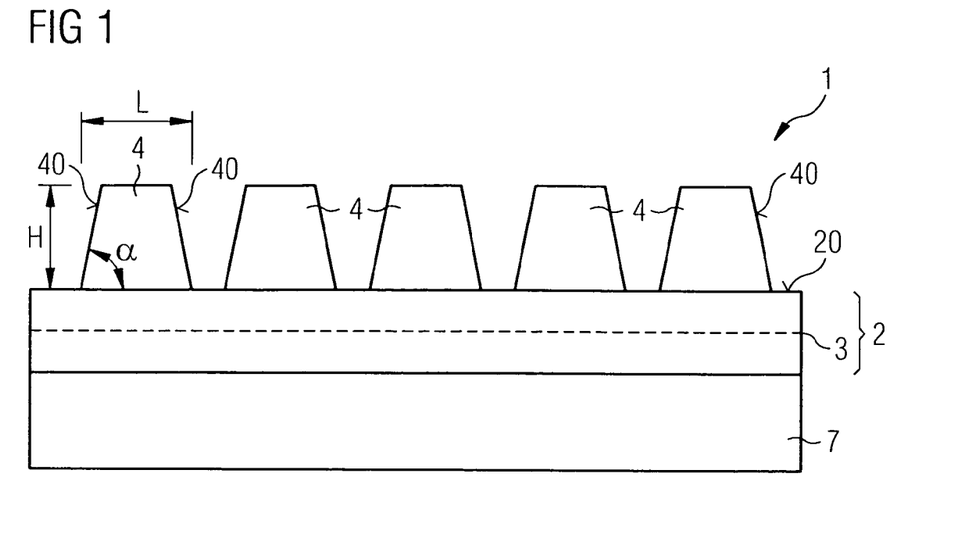
FIG. 1 shows a schematic sectional illustration of an exemplary embodiment of an optoelectronic semiconductor chip described here.

An exemplary embodiment of an optoelectronic semiconductor chip 1 is shown in FIG. 1. A semiconductor layer sequence 2 is situated on a substrate 7. The semiconductor layer sequence 2 comprises an active layer 3, in which an electromagnetic radiation is generated during the operation of the semiconductor chip 1. Both main sides of the semiconductor layer sequence 2 are smooth within the scope of the production tolerances and are not provided with a roughening. The substrate 7, too, has smooth main sides.

A side of the semiconductor layer sequence 2 which faces away from the substrate 7 forms a radiation passage area 20, which is formed by a material of the semiconductor layer sequence 2. The radiation passage area 20 forms a boundary area of the semiconductor layer sequence 2 which faces away from the substrate 7 and which is planar within the scope of the production tolerances.

Coupling-out structures 4 are applied at the radiation passage area 20, said coupling-out structures 4 being in direct contact with the radiation passage area 20. A material of the coupling-out structures 4 is different than the material of the semiconductor layer sequence 2. A height H of the coupling-out structures 4, in a direction perpendicular to the radiation passage area 20, is approximately 0.3 µm to 4 µm. A lateral extent L of the coupling-out structures 4, in a direction parallel to the radiation passage area 20, is approximately 1 µm to 7 µm. The coupling-out structures 4 are shaped in truncated-pyramid-like fashion or, preferably, in truncated-cone-like fashion. A facet 40 forming a lateral boundary area of the coupling-out structures 4 is at an angle α with respect to the radiation passage area 20 which is between approximately 15° and 75°, for example around 60°. A total area of the facets 40 amounts to at least 50% of an area content of the radiation passage area 20. It is likewise possible for the total area of the facets 40 to exceed the area content of the radiation passage area.

The material of the coupling-out structures 4 is transparent with respect to the radiation generated in the semiconductor layer sequence 2. Moreover, the material of the coupling-out structures 4 has a significantly poorer electrical conductivity than the material of the semiconductor layer sequence 2. A refractive index of the materials of the semiconductor layer sequence 2 and of the radiation passage area 20 and of the coupling-out structures 4 deviates from one another by at most 5%.

The substrate 7 can be a growth substrate on which the semiconductor layer sequence 2 is grown. It is likewise possible for the substrate 7 to be formed by a carrier substrate on which the semiconductor layer sequence 2 is fixed for example by rebonding or by a wafer transfer process.

Figure 2:
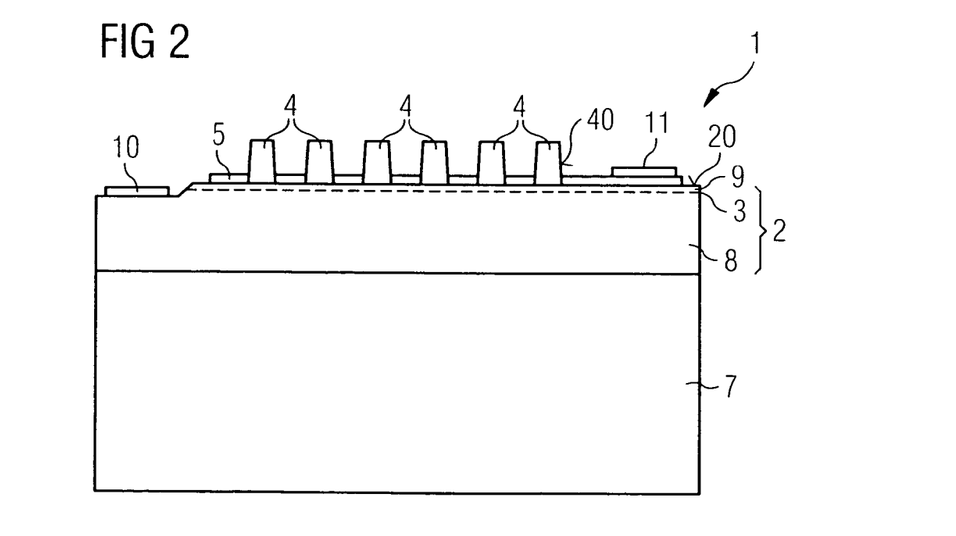
FIGS. 2 and 3 show schematic sectional illustrations of further exemplary embodiments of semiconductor chips described here.

FIG. 2 illustrates a further exemplary embodiment of the optoelectronic semiconductor chip 1. An n-conducting layer 8 is grown on the substrate 7, which can be fashioned with sapphire. The—at least in places—n-conducting layer 8 is based, like the entire semiconductor layer sequence 2 as well, on GaN. The active layer 3 is grown at a side of the n-conducting layer 8 which faces away from the substrate 7, a p-conducting layer 9 being situated above said active layer in a direction away from the substrate 7. A thickness of the p-conducting layer, in a direction perpendicular to the radiation passage area 20, is significantly smaller than a thickness of the n-conducting layer.

A conductive layer 5 is applied on the p-conducting layer 9 for the purpose of current distribution along the radiation passage area 20. The conductive layer 5 consists, for example, of indium tin oxide, indium zinc oxide or zinc oxide. A thickness of the conductive layer 5, in a direction perpendicular to the radiation passage area 20, is in this case 250 nm or less. The conductive layer 5 is completely penetrated by the coupling-out structures 4, such that the coupling-out structures 4 are in direct contact with the radiation passage area 20. A side of the conductive layer 5 which faces away from the semiconductor layer 2 is fashioned in a smooth manner within the scope of the production tolerances.

Cutouts in the conductive layer 5, into which the coupling-out structures 4 are introduced, can be produced by an etching process and/or by a photolithographic method. The radiation passage area 20 is fashioned in a planar manner and the coupling-out structures 4 rise above the semiconductor layer sequence 2, in a direction perpendicular to the radiation passage area 20. The coupling-out structures 4 are therefore not produced by material removal from the semiconductor layer sequence 2.

For the purpose of making electrical contact with the semiconductor layer sequence 2, an n-type contact 10 is applied on the n-conducting layer 8. A p-type contact 11 is situated on the conductive layer 5. The contacts 10, 11 are fashioned with a metal, for example.

An alternative possibility for forming the coupling-out structures 4 is provided by etching the semiconductor layer sequence 2. In this case, therefore, the coupling-out structures are produced by material removal from, in particular, the n-conducting layer 8 or the p-conducting layer 9. In order to be able to produce the coupling-out structures 4 in such a way, the n-conducting layer 8 or the p-conducting layer 9 must have a large thickness in order to be able to produce the necessary height H of the coupling-out structures that is required for efficient coupling-out.

A large thickness of the p- and n-conducting layers 8, 9 can lead to material strains in said layers 8, 9, for example as a result of thermal loads, such that a lifetime of the optoelectronic semiconductor chip 1 can be reduced. Inter alia, therefore, a smallest possible thickness of the layers 8, 9 is preferred. By virtue of the fact that a small thickness of the layers 8, 9 is preferred, the production of the coupling-out structures 4 by material removal from the semiconductor layer sequence 2 is a critical process since, in the case of material being removed to an excessively great extent, the active layer 3 can be damaged and the semiconductor chip 1 is then no longer usable.

By virtue of the coupling-out structures being applied to the semiconductor layer sequence 2, without material removal from the semiconductor layer sequence 2, therefore, firstly the critical process of etching the conductive layers 8, 9 is obviated. In addition, the thickness of the layers 8, 9 can be reduced and the lifetime of the optoelectronic semiconductor chip 1 can thus be increased.

Figure 3:
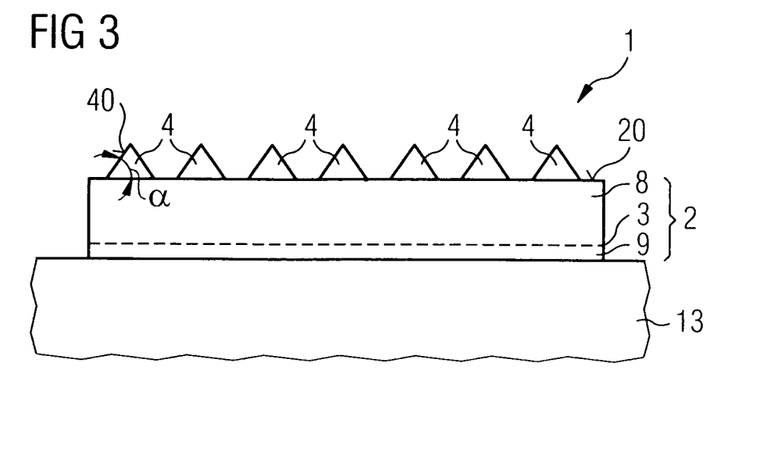

In the case of the exemplary embodiment of the semiconductor chip 1 in accordance with FIG. 3, the coupling-out structures 4 are shaped in cone-like fashion. The angle α between the facets 40 and the radiation passage area 20 is approximately 45°.

The coupling-out structures 4 are applied on the n-conducting layer 8. Since the n-conducting layer 8 has a greater transverse conductivity than the p-conducting layer 9, a conductive layer, such as in accordance with FIG. 2, for instance, is not necessary in this exemplary embodiment.

The carrier 13 is formed by a carrier substrate on which the semiconductor layer sequence 2 is fixed after growth on a growth substrate. Before the production of the coupling-out structures 4, a growth substrate (not depicted) was removed from the semiconductor layer sequence 2.

Optionally, the semiconductor chip 1 can have a potting body (not depicted). The potting body surrounds, for example, the semiconductor layer sequence 20 and the coupling-out structures 4.

Figure 4:
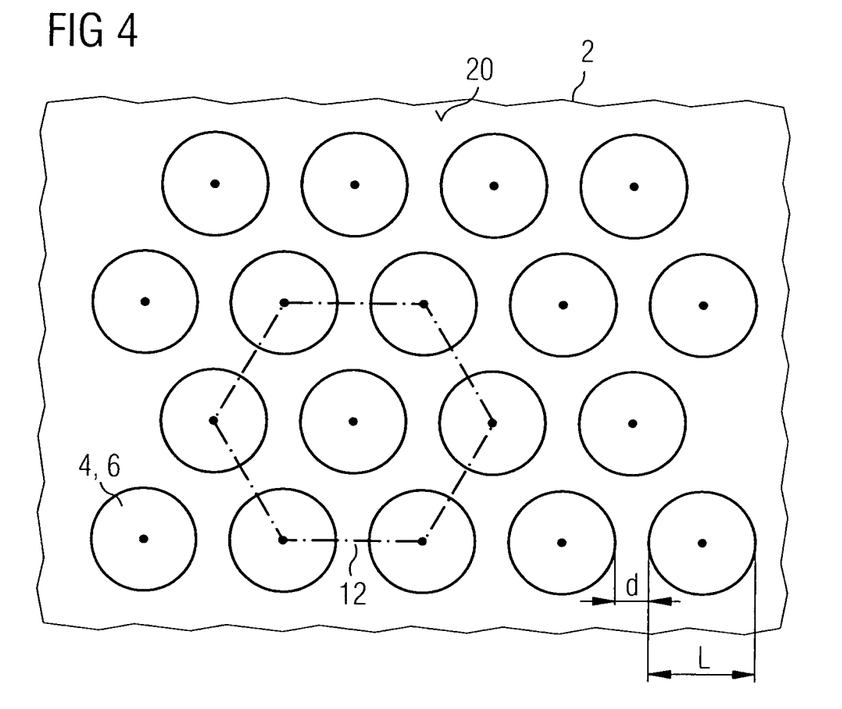
FIG. 4 shows a schematic plan view of a radiation passage area of a further exemplary embodiment of an optoelectronic semiconductor chip described here.

FIG. 4 shows a schematic plan view of an excerpt from the radiation passage area 20 of the semiconductor chip 1, for example in accordance with one of FIGS. 1 to 3. The coupling-out structures 4 form islands 6. Adjacent islands 6 or coupling-out structures 4 are separated from one another, that is to say that no connection between adjacent islands 6 is provided by the material of the coupling-out structures 4 or of the islands themselves. The islands 6 are in each case shaped in cone-like fashion, such that a respective island 6 can preferably correspond to precisely one of the coupling-out structures 4. A distance d between adjacent islands 6 is greater than the wavelength of the radiation generated in the semiconductor layer sequence 2.

The coupling-out structures 4 are arranged uniformly in a hexagonal pattern over the entire radiation passage area 20. The hexagonal pattern can be described geometrically by a grid 12 formed, within the scope of the production tolerances, by identical, regular, equilateral hexagons. The proportion of that area of the radiation passage area 20 which is covered by the islands 6 or by the coupling-out structures 4 amounts to approximately 50%.

Alternatively, it is likewise possible for the coupling-out structures 4 to be arranged in a square or rectangular grid, for instance, instead of the hexagonal grid 12. In contrast to FIGS. 1 to 3, the islands 6 or the coupling-out structures 4 can also have dome-like shapings similar to the segments of spheres or ellipsoids.

Figure 5:
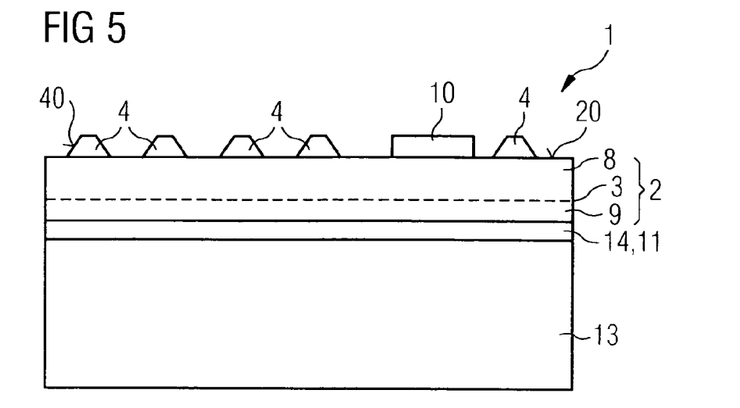
FIGS. 5 and 6 show schematic sectional illustrations of further exemplary embodiments of optoelectronic semiconductor chips described here.

FIG. 5 illustrates an exemplary embodiment of the optoelectronic semiconductor chip 1 in which the semiconductor layer sequence 2 is fashioned as a thin-film layer. The semiconductor layer 2 is applied on a carrier 13 via a connecting means 14. The carrier 13 is not a substrate on which the semiconductor layer sequence 2 with the active layer 3 was grown. In other words, the semiconductor layer sequence 2 is grown on a growth substrate (not depicted) and subsequently rebonded onto the carrier 13. The connecting means 14 can be a metallic solder. Preferably, the connecting means 14 has a reflective effect for the radiation generated in the semiconductor layer sequence 2. The p-type contact 11 is also realized via the connecting means 14.

The connecting means 14 can also be formed by a layer system and comprise, for example, one or a plurality of solders, at least one vapor-deposited metal layer and at least one reflective, in particular metallic, mirror layer.

A thickness of the p-conducting layer 9 facing the carrier 13 is approximately 100 nm to 2 μm in a direction perpendicular to the radiation passage area 20. The thickness of the n-conducting layer 8, facing away from the carrier 13, is, in particular, between approximately 2 μm and 10 μm inclusive. The total thickness of the semiconductor layer sequence 2, comprising the n-conducting layer 8, the p-conducting layer 9 and the active layer 3, is preferably in the range of between 1 μm and 7 μm inclusive. Neither the p-conducting layer 9 nor the n-conducting line 8 nor the carrier 13 are provided with a roughening. The carrier 13 preferably has a thickness of between 100 μm and 200 μm inclusive. A thickness of the connecting means 14 is preferably between 1 μm and 10 μm inclusive.

The coupling-out structures 4 in the form of truncated cones are applied directly on the radiation passage area 20 of the semiconductor layer sequence 2. The n-type contact 10 is likewise situated directly on the radiation passage area 20. The n-type contact 10 is preferably fashioned with a metallic material or consists of such a material.

Optionally, it is possible that, as for example in the case of the exemplary embodiment in accordance with FIG. 2, a layer (not depicted) in FIG. 5, comprising an electrically conductive material is situated on the radiation passage area 20 in regions between the coupling-out structures 4. Instead of or in addition to said conductive layer, the material of the coupling-out structures 4 can be electrically conductive.

Figure 6:
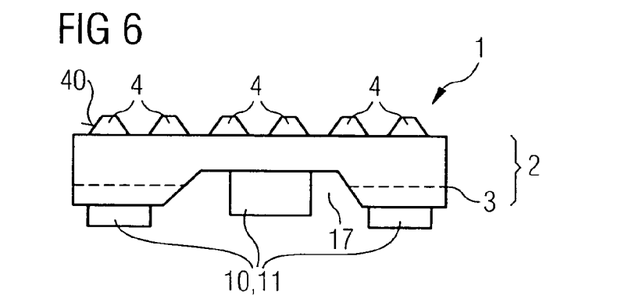

In the case of the exemplary embodiment in accordance with FIG. 6, the semiconductor layer sequence 2 has a cutout 17. The cutout 17 penetrates through the active layer 3 in places. One of the contacts 10, 11 is fitted in the cutout 17. In this exemplary embodiment of the semiconductor chip 1, the n-type contact 10 and the p-type contact 11 are situated at the same side of the semiconductor layer sequence 2. In contrast to the illustration shown in FIG. 6, it is possible for the contacts 10, 11 to terminate flush with one another in a direction away from the semiconductor layer sequence 2.

Figure 7:
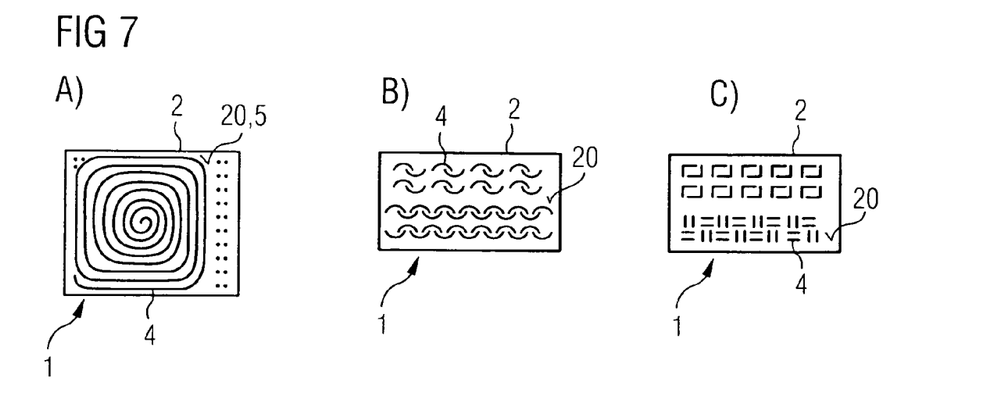
FIG. 7 shows schematic plan views of coupling-out structures and radiation passage areas of optoelectronic semiconductor chips described here.

In the case of the exemplary embodiments of the semiconductor chip 1 in accordance with FIGS. 1 to 6, the coupling-out structures 4 have a comparatively simple geometry. FIG. 7 illustrates examples of coupling-out structures 4 which have a more complex geometry or structure. The coupling-out structures 4 are in each case illustrated as lines in a simplified manner in FIG. 7. The facets 40 or contours of the coupling-out structures 4 are therefore not shown in FIG. 7.

In accordance with FIG. 7A, the coupling-out structure 4 is applied continuously in a single spiral on the radiation passage area 20 of the semiconductor layer sequence 2. The coupling-out structure 4 is therefore formed by a continuous, uninterrupted, elongated and spirally shaped region. If a conductive layer 5 is applied on the radiation passage area 20 in regions between the coupling-out structure 4, then said conductive layer 5 is not interrupted by the coupling-out structure 4 into partial areas that are electrically insulated from one another. In other words, said optional conductive layer 5 is also formed by a continuous, uninterrupted, areal region.

Furthermore, further coupling-out structures 4, for example shaped in truncated-cone-like fashion, can be present, alongside, for instance, the spiral coupling-out structure 4, in particular in edge regions of the radiation passage area 20.

In the case of the exemplary embodiment of the coupling-out structures 4 in accordance with FIG. 7B, the coupling-out structures 4 have an arc-like shaping in plan view. Different, arc-like coupling-out structures 4 in each case partly intermesh. Adjacent coupling-out structures 4 preferably do not touch one another in this case. Such a configuration of the coupling-out structures 4 makes it possible for the coupling-out structures 4 to cover a particularly high area proportion of the radiation passage area 20.

In FIG. 7C, the coupling-out structures 4 have L-shaped and I-shaped shapings. In particular the orientation of the I-shaped coupling-out structures 4 alternates in order to obtain a high coupling-out efficiency. Moreover, the semiconductor chip 1 in accordance with FIGS. 7B, 7C in each case has a rectangular, in particular non-square, basic contour in plan view.

Figure 8:
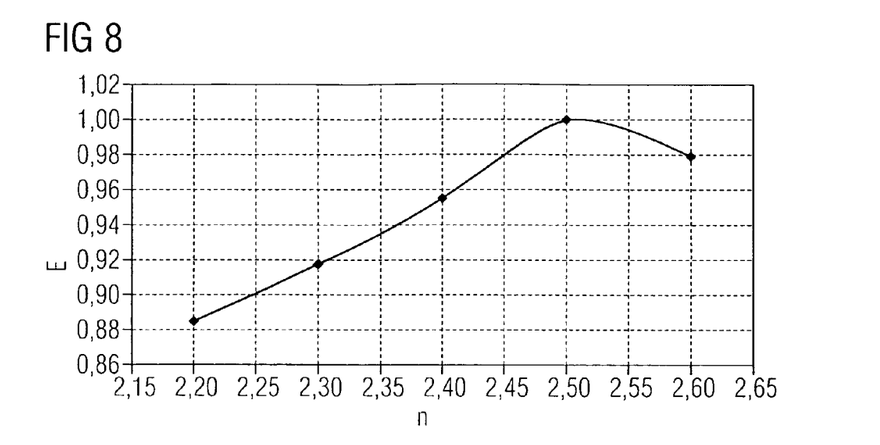
FIGS. 8 and 9 show schematic illustrations of the dependence of a coupling-out efficiency on various parameters for semiconductor chips described here.

FIG. 8 illustrates the profile of the coupling-out efficiency E with regard to coupling out radiation generated in the semiconductor layer sequence 2 from the semiconductor chip 1 as a function of the refractive index n of the material of the coupling-out structures 4. In this case, a maximum of the coupling-out efficiency E is scaled to 1. The curve illustrated relates to a semiconductor layer sequence 2 which is based on GaN and has a refractive index of approximately 2.5. The semiconductor layer sequence 2 and the coupling-out structures 4 are likewise surrounded by a potting composed of an epoxide, a silicone or an epoxide-silicone hybrid material having a refractive index of approximately 1.4 to 1.5.

The coupling-out structures 4 consist of $TiO_2$ and have a truncated-pyramid-shaped geometry having a square basic contour. The height H of the coupling-out structures is approximately 750 nm, the lateral extent L is approximately 1 μm and a width W at a top side is approximately 0.5 μm; also cf. FIG. 9B.

If the refractive index n of the coupling-out structures 4 is comparable to the refractive index of the semiconductor layer sequence 2, then the coupling-out efficiency E is maximal in accordance with FIG. 8. In the present case, this is the case for a refractive index n of the coupling-out structures 4 of approximately 2.5. This refractive index approximately corresponds to that of GaN. With a refractive index n of the material of the coupling-out structures 4 which deviates from 2.5, the coupling-out efficiency E decreases greatly.

Figure 9:
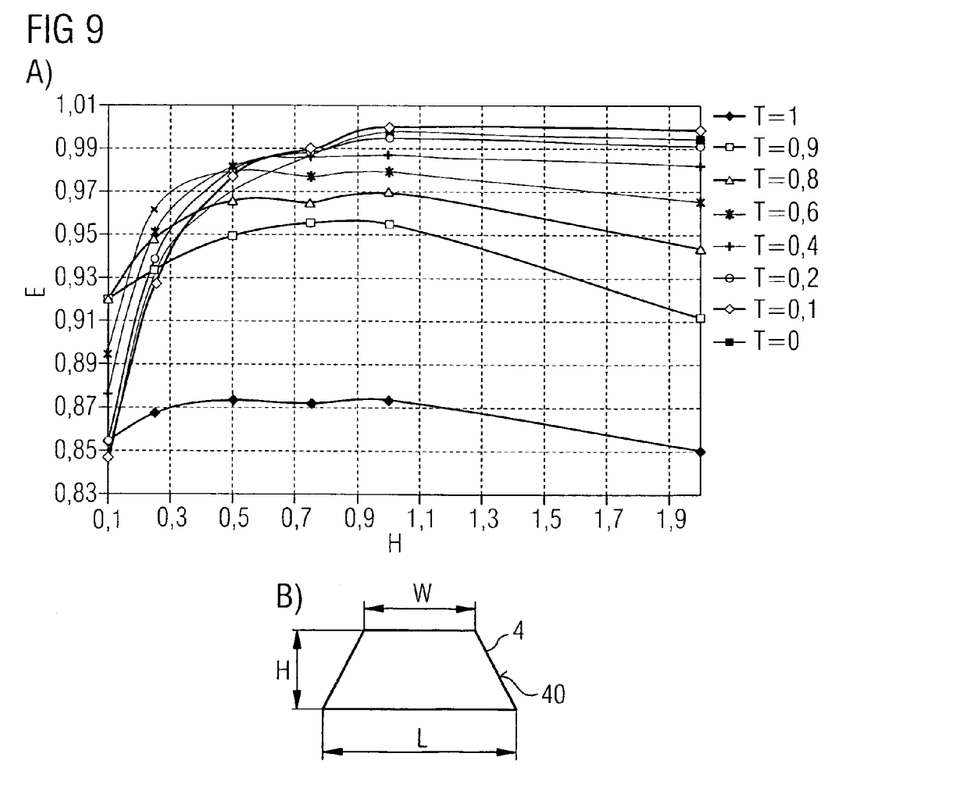

FIG. 9A illustrates a dependence of the coupling-out efficiency E on the height H and on a geometry parameter T of the coupling-out structures 4, for a semiconductor chip 1 analogous to FIG. 8. In accordance with FIG. 9A, the coupling-out efficiency E is greatest when the height H of the coupling-out structures 4, which are fashioned with $TiO_2$ in this example, is or exceeds approximately 750 nm.

The greater the height H of the coupling-out structures 4, the greater also the total area of the facets 40 of the coupling-out structures 4. Since the coupling-out efficiency E increases with the total area of the facets 40, a comparatively large height H of the coupling-out structures 4 should be chosen. Since the material of the coupling-out structures 4, such as $TiO_2$, for instance, exhibits a low residual absorption with regard to the radiation generated in the semiconductor layer sequence 2, excessively large heights H of the coupling-out structures 4 lead to absorption losses. Therefore, a height H of the coupling-out structures 4 of between approximately 0.5 μm and 2 μm inclusive is preferred.

The coupling-out structures 4 from FIG. 9A have, in accordance with FIG. 9B, a truncated-pyramid-like shape with a square basic contour. At the top side facing away from the radiation passage area 20, the coupling-out structures 4 have the width W. The geometry parameter T is defined as the quotient of the width W and the lateral extent L of the coupling-out structures 4. The following therefore holds true: T=W/L.

In FIG. 9A it can be seen that the coupling-out efficiency E increases as the geometry parameter T decreases. In other words, such coupling-out structures 4 in which the facets 40 are oriented almost perpendicularly to the radiation passage area 20 have a comparatively low coupling-out efficiency E. As the geometry parameter T decreases, the total area of the facets 40, that is to say of the lateral boundary areas of the coupling-out structures 4, said boundary areas being oriented obliquely with respect to the radiation passage area 20, and in association therewith also the coupling-out efficiency E increase.

Figure 10:
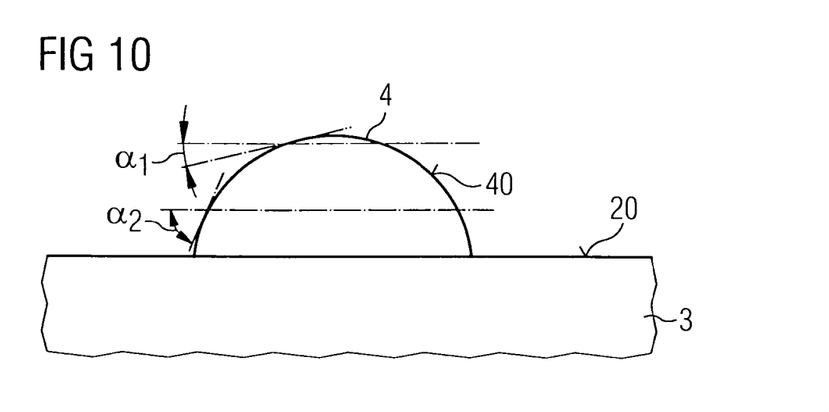
FIG. 10 shows a schematic side view of a dome-like coupling-out structure described here.

FIG. 10 illustrates a dome-like or sphere-segment-like coupling-out structure 4. The coupling-out structure 4 has a single, continuous boundary area facing away from the radiation passage area 20. The facet 40, which contributes to an increase in the coupling-out efficiency E, constitutes, in particular, only that part of the boundary area which is at an angle of between 15° and 75° inclusive with respect to the radiation passage area 20. This part—forming the facet 40—of the boundary area of the coupling-out structure 4 is situated between the two dash-dotted lines oriented parallel to the radiation passage area 20 in FIG. 10.

Figure 11:
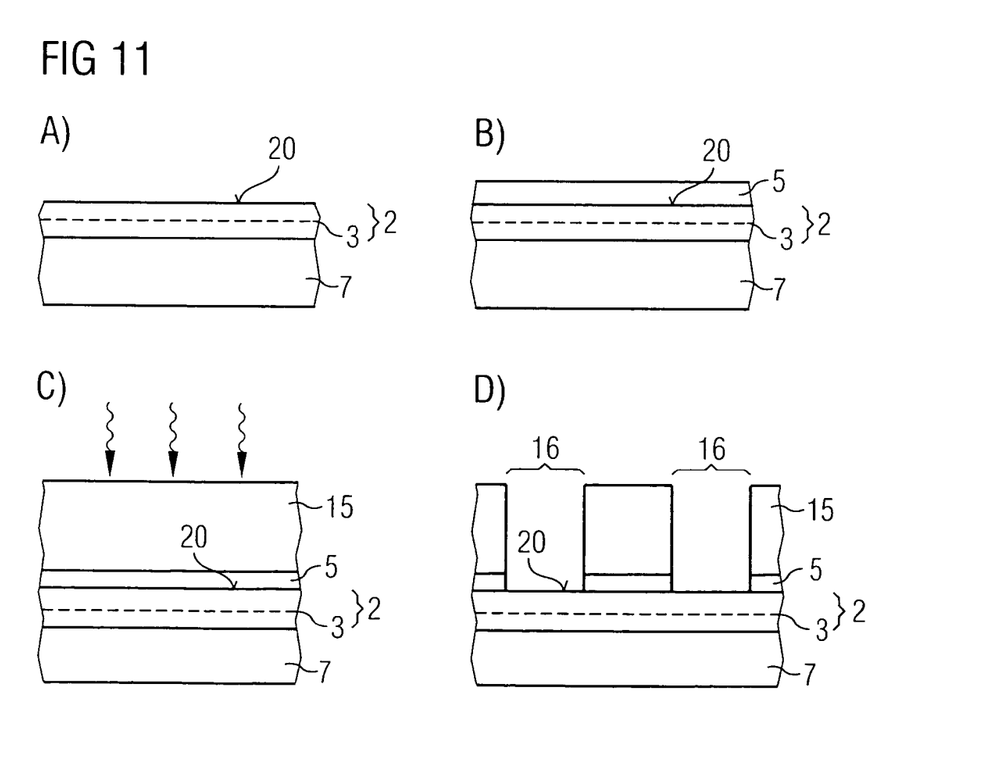
FIG. 11 shows a schematic illustration of a method described here for producing an optoelectronic semiconductor chip described here.

FIG. 11 illustrates a production method for the optoelectronic semiconductor chip 1. In accordance with FIG. 11A, the semiconductor layer sequence 2 with the active layer 3 is grown epitaxially on the substrate 7, which is a growth substrate.

In the optional method step in accordance with FIG. 11B, a conductive layer 5 is applied on the radiation passage area 20 of the semiconductor layer sequence 2. The optional conductive layer 5 consists, for example, of a transparent conductive oxide, for instance of ITO or ZnO.

FIG. 11C illustrates that a layer of a light-sensitive material 15 is applied on the radiation passage area 20 or on the conductive layer 5 and is patterned. By way of example, the light-sensitive material 15 is a photoresist, which is applied with a thickness that is preferably greater than the height H of the coupling-out structures 4 to be produced. The light-sensitive material is patterned, for example, by exposure with the aid of a photomask (not depicted in FIG. 11). Afterward, the light-sensitive material 15 can be developed, if appropriate.

FIG. 11D illustrates that the light-sensitive material 15 and optionally the conductive layer 5 are removed in partial regions 16. In particular, the radiation passage area 20 of the semiconductor layer sequence 2 is uncovered in the partial regions 16. In contrast to the illustration in FIG. 11D, the conductive layer 5 can remain with a reduced thickness in the partial regions 16.

In accordance with FIG. 11E, the coupling-out structures 40 are produced in the partial regions 16. It is possible for a material 45 of the coupling-out structures 4 also to be deposited on the light-sensitive material 15 outside the partial regions 16.

In accordance with FIG. 11F, the remaining light-sensitive material 15 not removed in the method step in accordance with FIG. 11D is removed. With this removal, undesired deposited material 45 possibly on the light-sensitive material 15 is also removed. The remaining light-sensitive material 15 can be removed by blowing away.

Figure 12:
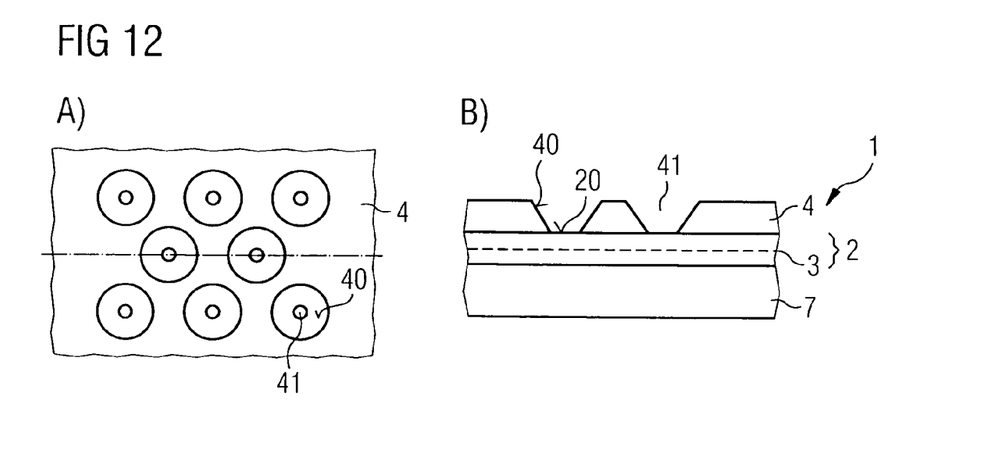
FIG. 12 shows a schematic plan view (A) and a schematic sectional illustration (B) of a further exemplary embodiment of an optoelectronic semiconductor chip described here.

In the case of the exemplary embodiment of the optoelectronic semiconductor chip 1 in accordance with FIG. 12, the coupling-out structures 4 have a plurality of openings 41. In this case, the material of the coupling-out structures 4 is applied in a continuous layer on the radiation passage area 20. The facets 40 of the coupling-out structures 4 are then formed by the openings 41, which completely penetrate through said layer and extend as far as the radiation passage area 20. The openings 41 have a truncated-cone-like shape, for example, wherein the openings 41 taper toward the radiation passage area 20.

In contrast to the illustration shown in FIG. 12, a plurality of mutually separate layer-like regions of the material of the coupling-out structures 4 can be applied at the radiation passage area 20, which in each case have a plurality of openings 41. Optionally, it is likewise possible for a conductive layer 5 (not depicted) to be situated between the coupling-out structures 4 and the semiconductor layer sequence 2, for example analogously to the semiconductor chip 1 in accordance with FIG. 2. It is possible for the openings 41 not to penetrate through said conductive layer 5.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:
1. An optoelectronic semiconductor chip comprising:
a semiconductor layer sequence comprising
at least one active layer configured to generate an electromagnetic radiation; and
coupling-out structures that are applied directly on a radiation passage area of the semiconductor layer sequence and have at least one continuous, layer-like region in which a plurality of openings are formed that completely penetrate through the layer-like region in a direction toward the radiation passage area,
wherein:
a material of the coupling-out structures is different than a material of the semiconductor layer sequence,
refractive indices of respective materials of the coupling-out structures and of the semiconductor layer sequence deviate from one another by at most 30%, and
facets of the coupling-out structures have a total area amounting to at least 5% of an area content of the radiation passage area, and
the facets of the coupling-out structures are at least partly formed by the openings,
wherein the radiation passage area is planar,
wherein the semiconductor layer sequence comprises at least one of GaN, InGaN, AlGaN and AlInGaN, and
wherein the coupling-out structures comprise at least one of $TiO_2$, ZnS, AlN, SiC, BN, $Ta_2O_5$.

2. An optoelectronic semiconductor chip comprising:
a semiconductor layer sequence comprising:
at least one active layer configured to generate an electromagnetic radiation;
at least one conductive layer is applied in places on a radiation passage area of the semiconductor layer sequence, wherein the conductive layer is a transparent conductive oxide, a thickness of the conductive layer in a direction perpendicular to the radiation passage area is 250 nm or less;
coupling-out structures that completely penetrate through the at least one conductive layer, which are applied at least indirectly on the radiation passage area of the semiconductor layer sequence, wherein a height of the coupling out structures is between 0.3 μm and 10 μm inclusive in a direction perpendicular to the radiation passage area; and
islands formed by a material of the coupling-out structures, wherein adjacent islands are separated from one another,
wherein:
the material of the coupling-out structures is different than a material of the semiconductor layer sequence,
refractive indices of the materials of the coupling-out structures and of the semiconductor layer sequence deviate from one another by at most 30%, and
facets of the coupling-out structures have a total area amounting to at least 5% of an area content of the radiation passage area,
wherein the thickness of the conductive layer is smaller than the height of the coupling out structures.

3. The optoelectronic semiconductor chip according to claim 2, wherein the facets are those boundary areas or parts of the boundary areas of the coupling-out structures which form an angle of at least 15° and of at most 75° with the radiation passage area.

4. The optoelectronic semiconductor chip according to claim 2, wherein the coupling-out structures have a lateral extent of between 0.2 µm and 10 µm inclusive in a direction parallel to the radiation passage area.

5. The optoelectronic semiconductor chip according to claim 2, wherein the coupling-out structures are fashioned in truncated-pyramid-like fashion, in sphere-segment-like fashion, in dome-like fashion and/or in truncated-cone-like fashion, wherein a base area of the coupling-out structures faces the radiation passage area.

6. The optoelectronic semiconductor chip according to claim 2, wherein the material of the coupling-out structures is transparent and dielectric.

7. The optoelectronic semiconductor chip according to claim 2, wherein the material of the coupling-out structures contains or consists of one of the following substances: $TiO_2$, ZnS, AlN, SiC, BN, $Ta_2O_5$.

8. The optoelectronic semiconductor chip according to claim 2, wherein the total area of the facets of the coupling-out structures amounts to at least 20% of the area content of the radiation passage area.

9. The optoelectronic semiconductor chip according to claim 2, wherein the material of the coupling-out structures has a refractive index of between 2.4 and 2.6 inclusive.

10. The optoelectronic semiconductor chip according to claim 2, wherein
    the material of the semiconductor layer sequence is based on GaN, InGaN, AlGaN and/or AlInGaN,
    the angle ($\alpha$) between the radiation passage area and the facets of the coupling-out structures is between 30° and 60° inclusive, and
    the coupling-out structures are shaped in truncated-cone-like fashion and consist of $TiO_2$.

11. A method for producing an optoelectronic semiconductor chip comprising:
    growing a semiconductor layer sequence comprising at least one active layer on a substrate;
    applying and patterning a light-sensitive material at a radiation passage area of the semiconductor layer sequence;
    removing the light-sensitive material in partial regions;
    producing coupling-out structures at least indirectly at the radiation passage area in the partial regions, a height of the coupling out structures is between 0.3 µm and 10 µm inclusive in a direction perpendicular to the radiation passage area;
    removing the remaining light-sensitive material, wherein a material of the coupling-out structures is different than a material of the semiconductor layer sequence and the materials differ from one another in terms of the refractive index by at most 30%, and wherein a total area of facets of the coupling-out structures amounts to at least 30% of an area content of the radiation passage area;
    forming islands with a material of the coupling-out structures, wherein adjacent islands are separated from one another; and
    applying at least one conductive layer in places on the radiation passage area of the semiconductor layer sequence having a thickness in a direction perpendicular to the radiation passage area of 250 nm or less, wherein the at least one conductive layer is a transparent conductive oxide,
    wherein the coupling-out structures completely penetrate through the at least one conductive layer,
    wherein the thickness of the conductive layer is smaller than the height of the coupling out structures.

12. The method according to claim 11, wherein, prior to applying and patterning the light-sensitive material, a conductive layer is produced at least in places between said material and the radiation passage area, and wherein, with the removal of the light-sensitive material in the partial regions, the conductive layer is partly or completely removed in said partial regions.

13. The optoelectronic semiconductor chip according to claim 2, wherein
    the islands project above the at least one conductive layer in a direction away from the radiation passage area and
    a side of the conductive layer that is remote from the radiation passage area is free of the coupling out structures.

14. The optoelectronic semiconductor chip according to claim 2,
    wherein the radiation passage area is completely covered by the conductive layer and the coupling-out structures,
    wherein the conductive layer and the coupling-out structures are in direct contact with the semiconductor layer sequence,
    wherein a surface of the conductive layer remote from the semiconductor layer sequence and the radiation passage area are smooth, and
    the conductive layer comprises at least one of indium tin oxide, indium zinc oxide, or zinc oxide.

* * * * *

UNITED STATES PATENT AND TRADEMARK OFFICE
CERTIFICATE OF CORRECTION

| | | |
|---|---|---|
| PATENT NO. | : 8,816,353 B2 | Page 1 of 1 |
| APPLICATION NO. | : 13/138034 | |
| DATED | : August 26, 2014 | |
| INVENTOR(S) | : Nikolaus Gmeinwieser et al. | |

It is certified that error appears in the above-identified patent and that said Letters Patent is hereby corrected as shown below:

In the Claims

Column 18, lines 23-29 should read

12. The method according to claim 11, wherein, prior to applying and patterning the light-sensitive material, the conductive layer is produced at least in places between said material and the radiation passage area, and wherein, with the removal of the light-sensitive material in the partial regions, the conductive layer is partly or completely removed in said partial regions.

Signed and Sealed this
Third Day of February, 2015

Michelle K. Lee
*Deputy Director of the United States Patent and Trademark Office*